(12) United States Patent
Kamijima

(10) Patent No.: US 7,700,482 B2
(45) Date of Patent: Apr. 20, 2010

(54) PATTERNED MATERIAL LAYER, METHOD OF FORMING THE SAME, MICRODEVICE, AND METHOD OF MANUFACTURING THE SAME

(75) Inventor: Akifumi Kamijima, Tokyo (JP)

(73) Assignee: TDK Corporation, Tokyo ( * ) Notice: Subject to any disclaimer, the term of this patent is extended or adjusted under 35 U.S.C. 154(b) by 570 days.

(21) Appl. No.: 11/364,068

(22) Filed: Mar. 1, 2006

(65) Prior Publication Data

US 2006/0228877 A1 Oct. 12, 2006

(30) Foreign Application Priority Data

Apr. 7, 2005 (JP) .............................. 2005-111326

(51) Int. Cl.
*H01L 21/44* (2006.01)
(52) U.S. Cl. ............... 438/670; 438/951; 257/E21.034; 257/E21.033
(58) Field of Classification Search ................ 438/670, 438/669, 725, 754, 951; 257/E21.033, E21.034, 257/E21.038
See application file for complete search history.

(56) References Cited

U.S. PATENT DOCUMENTS 6,596,468 B1 * 7/2003 Han et al. ................... 430/315
6,737,202 B2 * 5/2004 Gehoski et al. ................. 430/5
2004/0114652 A1 * 6/2004 Yoshikawa .................... 372/46

FOREIGN PATENT DOCUMENTS

| JP | A 11-175915 | 7/1999 |
| JP | A 2001-023984 | 1/2001 |
| JP | A 2002-197612 | 7/2002 |

\* cited by examiner

*Primary Examiner*—Asok K Sarkar
*Assistant Examiner*—Julia Slutsker
(74) *Attorney, Agent, or Firm*—Oliff & Berridge, PLC

(57) ABSTRACT

A method of forming a patterned material layer, the method comprising: a resist layer forming step of forming a resist layer on a substrate, the resist layer including a first photosensitive resin layer, an intermediate resin layer, and a second photosensitive resin layer; an exposing step; a developing step of partly removing the resist layer so as to form a trench exposing the substrate and partly removing the intermediate resin layer so as to form a groove on a side face of the trench, thereby forming a resist frame; a vacuum coating step of forming a vacuum coating layer having a material pattern part covering the exposed part of the substrate and a part to lift off covering the resist frame; and a liftoff step of removing the part to lift off in the vacuum coating layer together with the resist frame, so as to yield a patterned material layer.

12 Claims, 15 Drawing Sheets

Fig.15
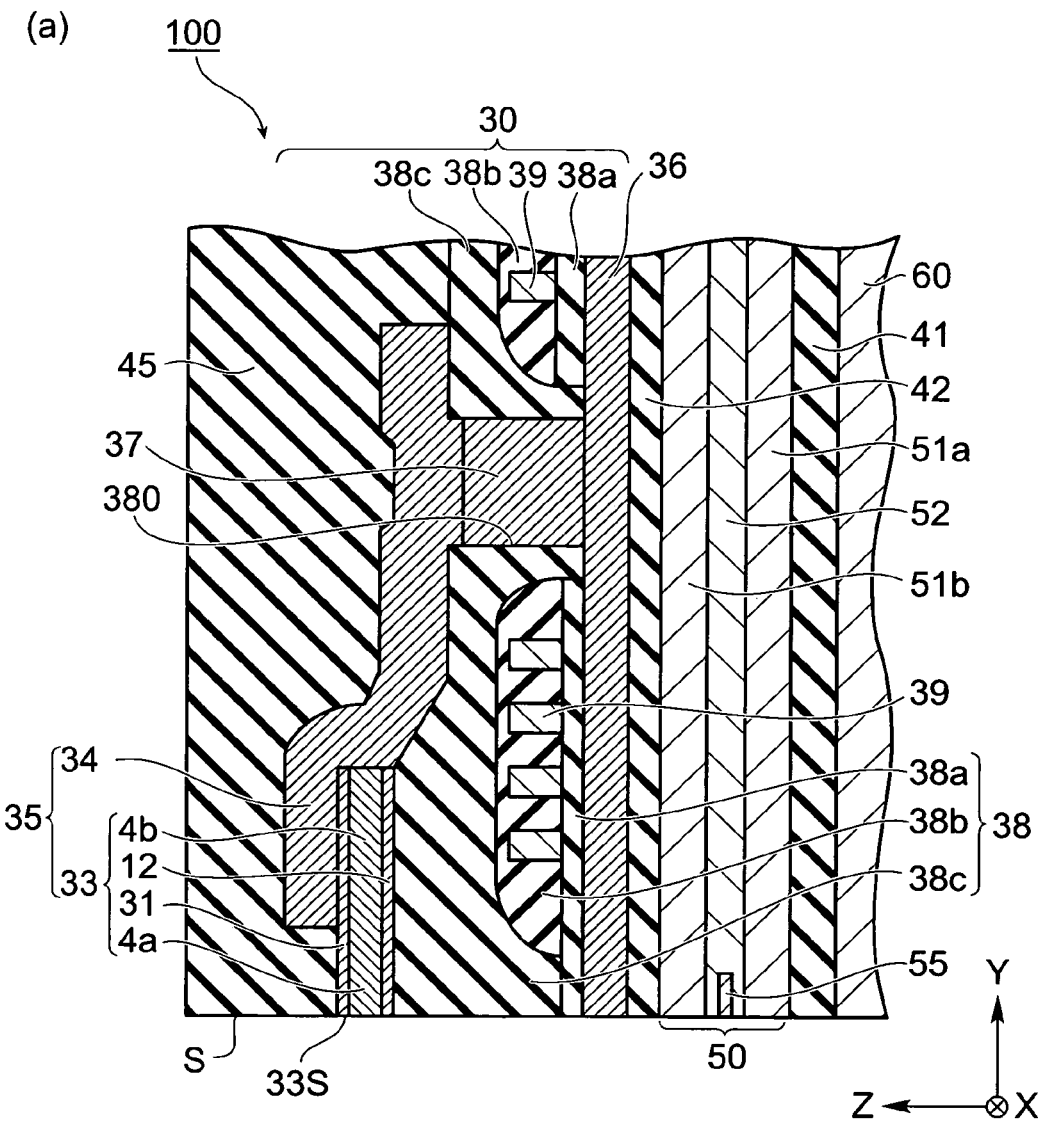
(a)
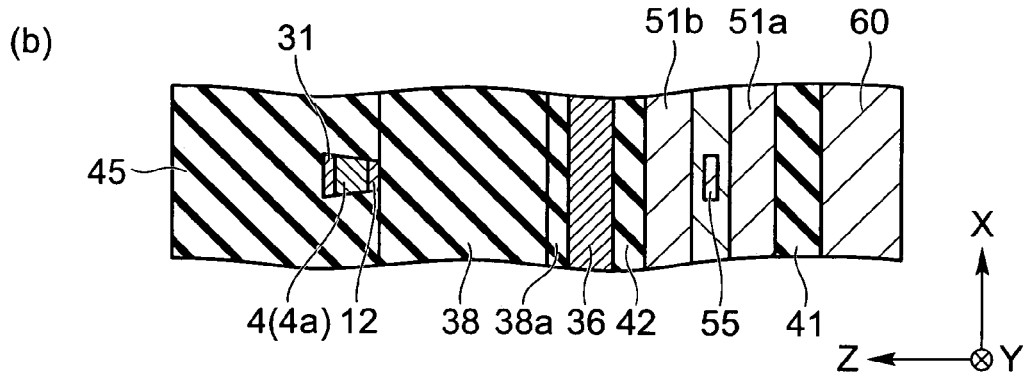
(b)

PATTERNED MATERIAL LAYER, METHOD OF FORMING THE SAME, MICRODEVICE, AND METHOD OF MANUFACTURING THE SAME

BACKGROUND OF THE INVENTION

1. Field of the Invention

The present invention relates to a patterned material layer, a method of forming the same, a microdevice, and a method of manufacturing the same.

2. Related Background Art

In the manufacture of microdevices such as thin-film magnetic heads, thin-film inductors, semiconductor devices, thin-film sensors, and thin-film actuators, patterned material layers made of predetermined materials such as magnetic materials and conductive materials are formed by such methods as vacuum coating methods like sputtering and frame plating methods using resist frames (Japanese Patent Application Laid-Open Nos. HEI 11-175915, 2001-23984, and 2002-197612).

SUMMARY OF THE INVENTION

Methods forming a material layer by vacuum coating can easily turn various materials into thin films and can employ a wide range of materials. In the case of magnetic materials, for example, these methods are also advantageous in that they yield material layers with a saturated magnetic flux density higher than that in material layers formed by frame plating.

When patterning a material layer by vacuum coating, however, the accuracy (in the contrast or the like) of formed patterns tends to be lower than that obtained by frame plating. Also, it has been difficult for the vacuum coating to adjust the angle formed between a side face of a patterned material layer and a substrate to a right angle or any other given angle. In particular, it has been very difficult for vacuum coating to pattern material layers made of inorganic materials such as metals such that they have a side face perpendicular to a substrate while yielding a certain extent of thickness. Therefore, it has conventionally been inevitable in practice to employ other methods such as frame plating when patterning a material layer having a certain extent of thickness.

In view of the foregoing circumstances, it is an object of the present invention to provide a method of forming a patterned material layer which can pattern a material layer formed on a substrate by vacuum coating with a sufficiently high accuracy even when its thickness is large and can easily form a right angle or any other given angle between a side face and the substrate.

For achieving the above-mentioned object, in one aspect, the present invention provides a method of forming a patterned material layer, the method comprising a resist layer forming step of forming a resist layer on a substrate, the resist layer having a first photosensitive resin layer, an intermediate resin layer soluble in a developing solution, and a second photosensitive resin layer which are laminated in this order; an exposing step of exposing the resist layer to light in a predetermined pattern; a developing step of partly removing the resist layer so as to form a trench exposing the substrate and partly removing the intermediate resin layer so as to form a groove on a side face of the trench by dissolution into the developing solution, thereby forming a resist frame; a vacuum coating step of forming a vacuum coating layer having a material pattern part covering the exposed part of the substrate and a part to lift off covering the resist frame by vacuum coating process; and a liftoff step of removing the part to lift off in the vacuum coating layer together with the resist frame, so as to yield a patterned material layer.

In the method of forming a patterned material layer in accordance with the present invention, vacuum coating is performed while a resist layer having a three-layer structure made of a first photosensitive resin layer, an intermediate resin layer, and a second photosensitive resin layer, in which a groove is formed on a side face of a trench by dissolving the intermediate resin layer into a developing solution, is used as a frame, whereby the vacuum coating layer in the part formed above the resist layer can selectively be removed (lifted off) together with the resist layer after the vacuum coating. Namely, material layers formed by vacuum coating can directly be patterned according to a highly accurate resist frame as in frame plating. As a consequence, material layers formed on a substrate by vacuum coating can be patterned with a sufficiently high precision even when they have a large thickness, while a right angle or any other given angle can easily be formed between a side face and the substrate.

Preferably, in the vacuum coating step, the vacuum coating layer is formed so as to yield a gap between the material pattern part and the part to lift off near the groove. This enable the part to lift off to be selectively removed more reliably in the liftoff step.

The method of forming a patterned material layer in accordance with the present invention may further comprise a plating layer forming step of forming a plating layer covering an exposed part of the substrate, whereas the material pattern part may cover the plating layer.

This method can pattern a material layer configured such that a layer formed by vacuum coating is laminated on the plating layer. This method can yield a selectively high saturated magnetic flux density in a part on a side to become a trailing edge in the forming of a magnetic pole (magnetic flux releasing part) in a magnetic head for perpendicular magnetic recording, for example.

Preferably, the vacuum coating is sputtering or vacuum evaporation, since the part to lift off can be formed easily in particular thereby such as to be removed selectively and so forth.

In another aspect, the present invention provides a patterned material layer obtainable by the method of forming a patterned material layer. The patterned material layer yields a high saturated magnetic flux in the case of a magnetic material, for example, since it has a layer formed by vacuum coating in at least a part thereof.

In still another aspect, the present invention provides a method of manufacturing a microdevice, the method including the step of forming a patterned material layer on a substrate by the method of forming a material pattern in accordance with the present invention. In still another aspect, the present invention provides a microdevice obtainable by the method of manufacturing a microdevice in accordance with the present invention.

BRIEF DESCRIPTION OF THE DRAWINGS

FIG. 15 is a sectional view showing a magnetic head for perpendicular magnetic recording as an embodiment of the microdevice in accordance with the present invention.

DESCRIPTION OF THE PREFERRED EMBODIMENTS

In the following, preferred embodiments of the present invention will be explained in detail with reference to the drawings. However, the present invention is not limited to the following embodiments. Parts identical or equivalent to each other will be referred to with numerals identical to each other without repeating their overlapping descriptions.

First Embodiment

FIGS. 1, 2, 3, and 4 are sectional views for explaining the first embodiment of the method of forming a patterned material layer in accordance with the present invention.

Figure 1:
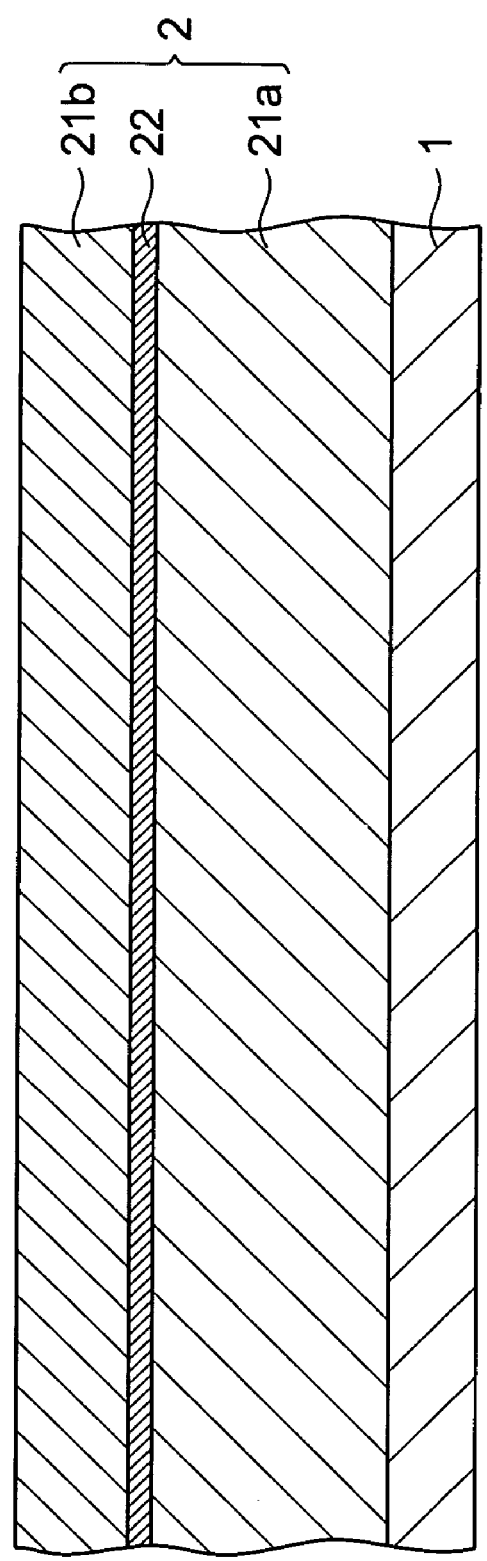
FIG. 1 is a sectional view for explaining a first embodiment of the method of forming a patterned material layer in accordance with the present invention.

In the first embodiment, as shown in FIG. 1, a resist layer 2 having a three-layer structure in which a first photosensitive resin layer 21a, an intermediate resin layer 22 soluble in a developing solution after being exposed to light, and a second photosensitive resin layer 21b are laminated in this order is initially formed on a substrate 1 (resist layer forming step).

The material for the substrate 1 is appropriately chosen according to the use of the material layer formed and the like. Specifically, substrates made of Si, ceramics ($Al_2O_3 \cdot TiC$, etc.), polymer materials, and the like are used.

The first photosensitive resin layer 21a and second photosensitive resin layer 21b are formed by spin coating or the like using a photosensitive resin which becomes soluble in a developing solution after being exposed to light, and are prebaked if necessary. Chemically amplified photosensitive resins such as polyhydroxystyrene-based resin and the like are favorably used as the photosensitive resin.

The intermediate resin layer 22 is formed by an alikali- or water-soluble resin which is soluble in a developing solution such as alkaline developing solution after being exposed to light or without being exposed to light. Examples of alkali-soluble resins which can favorably be used as a resin forming the intermediate resin layer 22 include PMGI (polymethylglutarimide), polyvinyl alcohol, polyacrylic acid, polyvinyl acetal, polyvinyl pyrrolidone, polyethyleneimine, polyethylene oxide, styrene/maleic acid copolymer, polyvinylamine resin, polyallylamine, oxazoline-group-containing water-soluble resin, water-soluble melamine resin, water-soluble urea resin, alkyd resin, and sulfonamide resin. The intermediate resin layer 22 may also be formed by a photosensitive resin having a higher exposure light sensitivity and a higher developing speed after exposure than those of the photosensitive resin forming the first and second photosensitive resin layers. The intermediate resin layer 22 is also formed by spin coating or the like, and is prebaked if necessary.

Preferably, the first photosensitive resin layer 21a and second photosensitive resin layer 21b have a thickness of 0.1 to 10 μm. Preferably, the thickness of the intermediate resin layer 22 is smaller than that of the first and second photosensitive resin layers, and specifically falls within the range of 0.001 to 10 μm. When the thickness of the intermediate resin layer 22 is less than 0.001 μm, grooves formed in a later developing step will become thinner, so that films to be patterned formed by vacuum coating will be harder to remove selectively from above a resist frame. When the thickness of the intermediate resin layer 22 exceeds 10 μm, the grooves formed in the later developing step will become greater, so that films to be patterned may also be formed within the grooves, which tends to cause a problem that films to be patterned are harder to lift off selectively.

Figure 2:
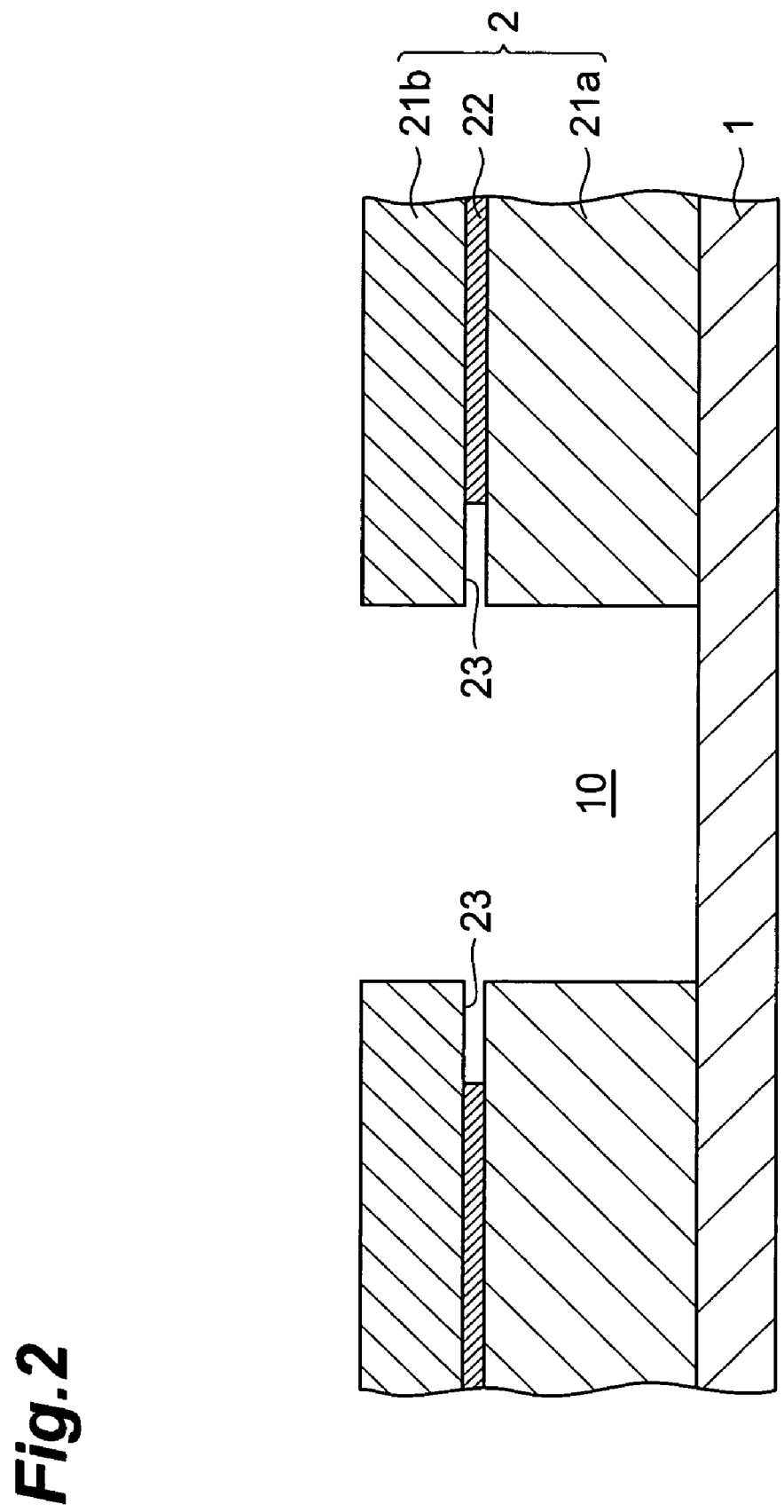
FIG. 2 is a sectional view for explaining the first embodiment of the method of forming a patterned material layer in accordance with the present invention.

After being exposed to light in a predetermined pattern in the exposing step, the resist layer 2 is dissolved in a developing solution, whereby the exposed part of the resist layer 2 is removed, so as to form a trench 10 exposing the substrate 1, and the part of the intermediate resin layer 22 on side faces of the trench 10 is removed so as to form grooves 23, thus forming a resist frame made of the patterned resist layer 2 (developing step, FIG. 2). In the developing step, the exposed part of the resist layer 2 is removed, and the part of intermediate resin layer 22 near the exposed part is also dissolved in the developing solution since the latter infiltrates therein, thus forming the grooves 23. For the purpose of the present invention, it will be preferred if the depth of the grooves 23 is 0.01 to 10.0 μm.

In the exposing step, an active light beam at a wavelength of 248 nm (KrF excimer laser), 192 nm (ArF excimer laser), or the like is emitted in a predetermined pattern through a mask or the like, while using a stepper, scanner, or the like.

Any developing solution is usable as long as it can dissolve the exposed part of first photosensitive resin layer 21a and second photosensitive resin layer 21b and the intermediate resin layer 22. For example, alkaline developing solutions such as aqueous solutions of tetramethylammonium hydroxide are favorably used. The other developing conditions are the same as those in typical photolithography. Instead of the foregoing mode, the first and second photosensitive resin layers 21a, 21b may be formed by a photosensitive resin which becomes insoluble in the developing solution after being exposed to light, and unexposed parts of the resist layer 2 may be removed in the developing step, so as to form a trench.

Figure 3:
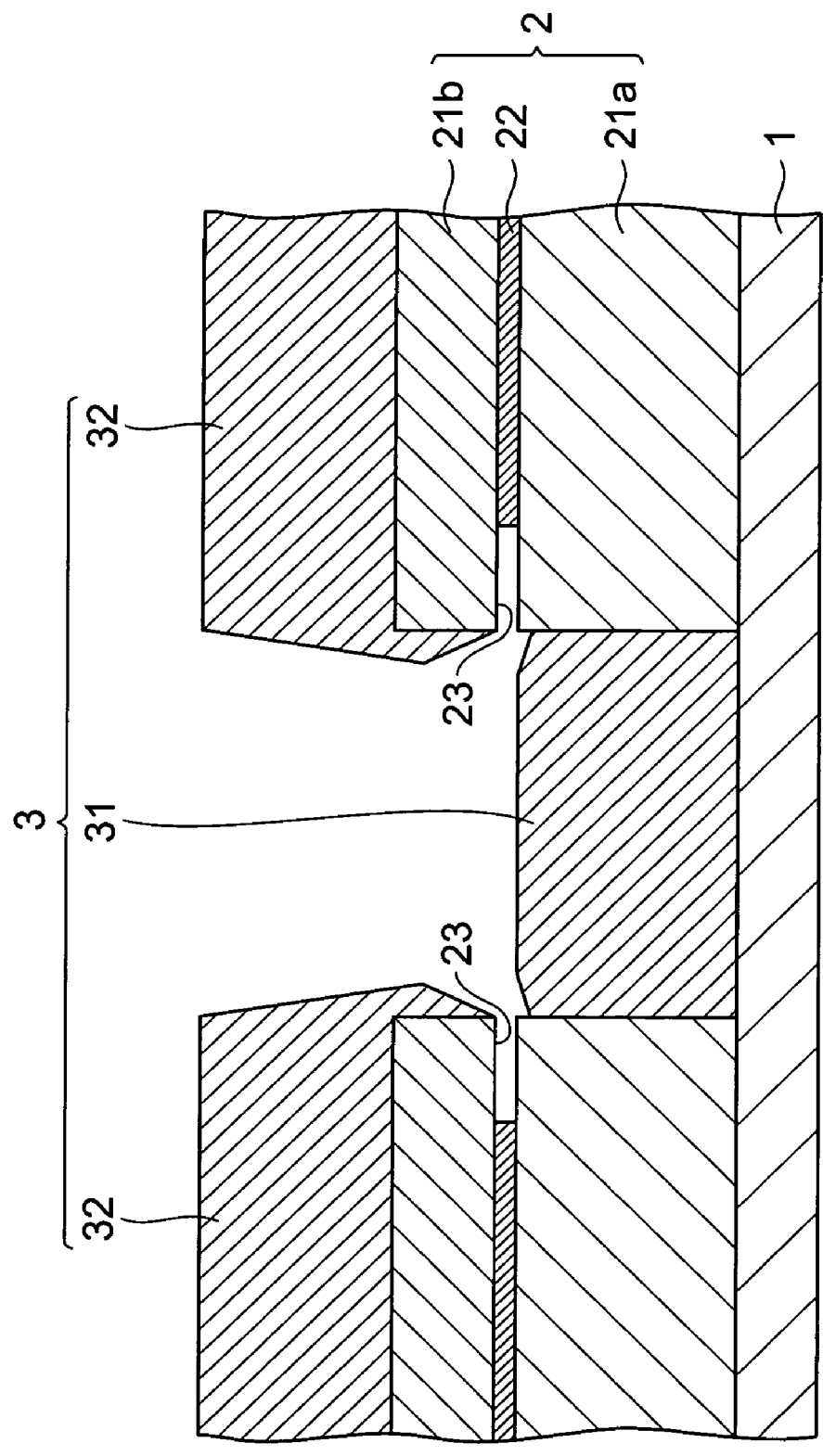
FIG. 3 is a sectional view for explaining the first embodiment of the method of forming a patterned material layer in accordance with the present invention.

Subsequently, as shown in FIG. 3, a vacuum coating layer 3 is formed by vacuum coating. The vacuum coating layer 3 includes a material pattern part 31 covering the exposed part of the substrate 1 in the trench 10 and a part to lift off 32 covering the resist frame.

Since the grooves 23 are formed on side faces of the resist frame (resist layer 2), a gap can be formed near the grooves 23 between the material pattern part 31 and part to lift off 32 formed by vacuum coating, so as to separate these parts from each other. For forming such a gap more reliably, it will be preferred if the thickness of the vacuum coating layer 3 is smaller than that of the first photosensitive resin layer 21a.

The vacuum coating is preferably sputtering or vapor deposition, sputtering in particular. The material forming the vacuum coating layer is appropriately chosen according to the use of the patterned material layer and the like. Examples of the material include NiFe (Permalloy), CoNiFe, and Cu. Preferably, in order to form the gap more reliably near the grooves 23, the sputtering angle (the angle with respect to a main surface of the substrate) falls within the range of 70 to 90 degrees.

Figure 4:
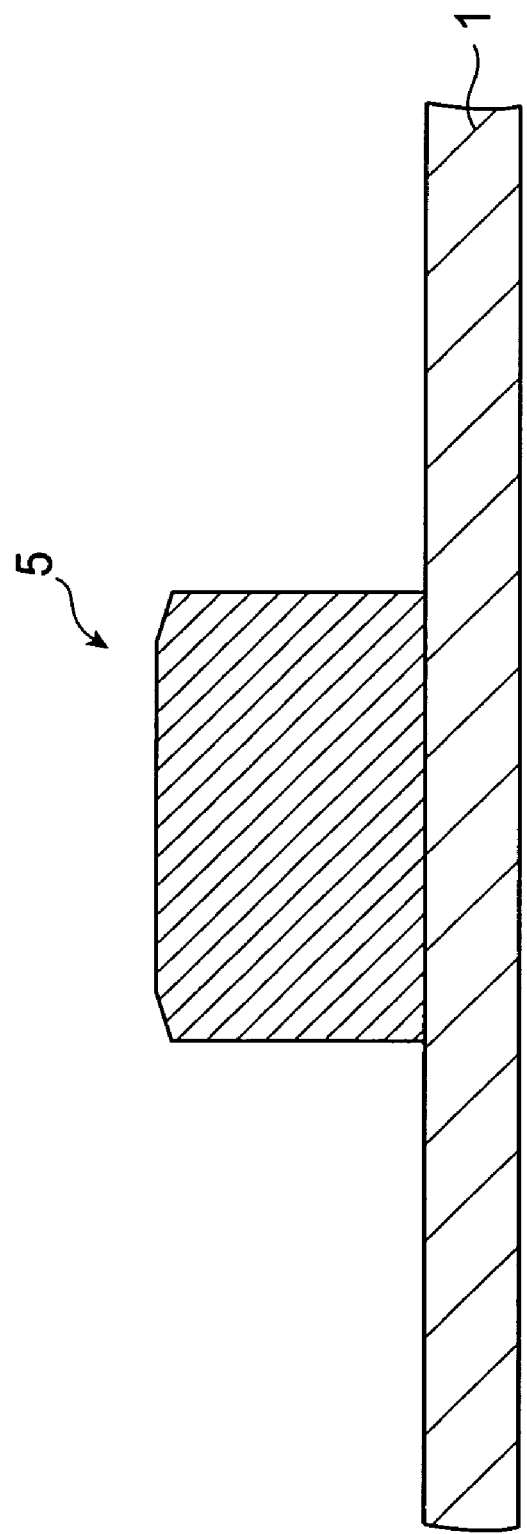
FIG. 4 is a sectional view for explaining the first embodiment of the method of forming a patterned material layer in accordance with the present invention.
Figure 5:
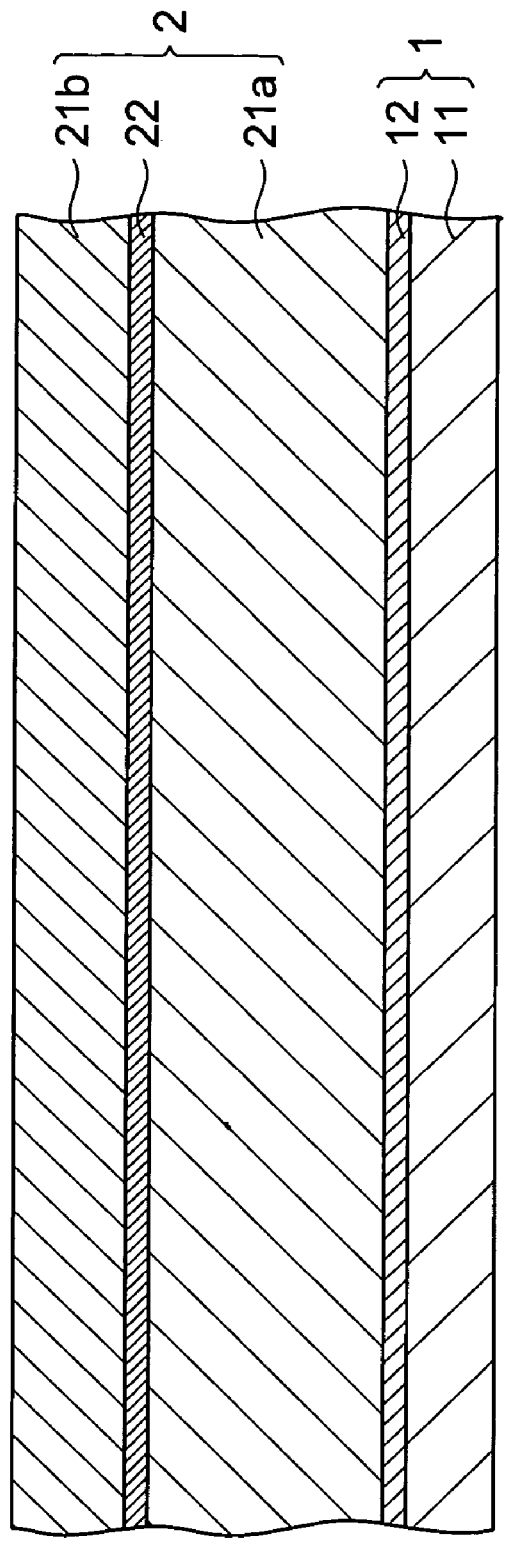
FIG. 5 is a sectional view for explaining a second embodiment of the method of forming a patterned material layer in accordance with the present invention.
Figure 6:
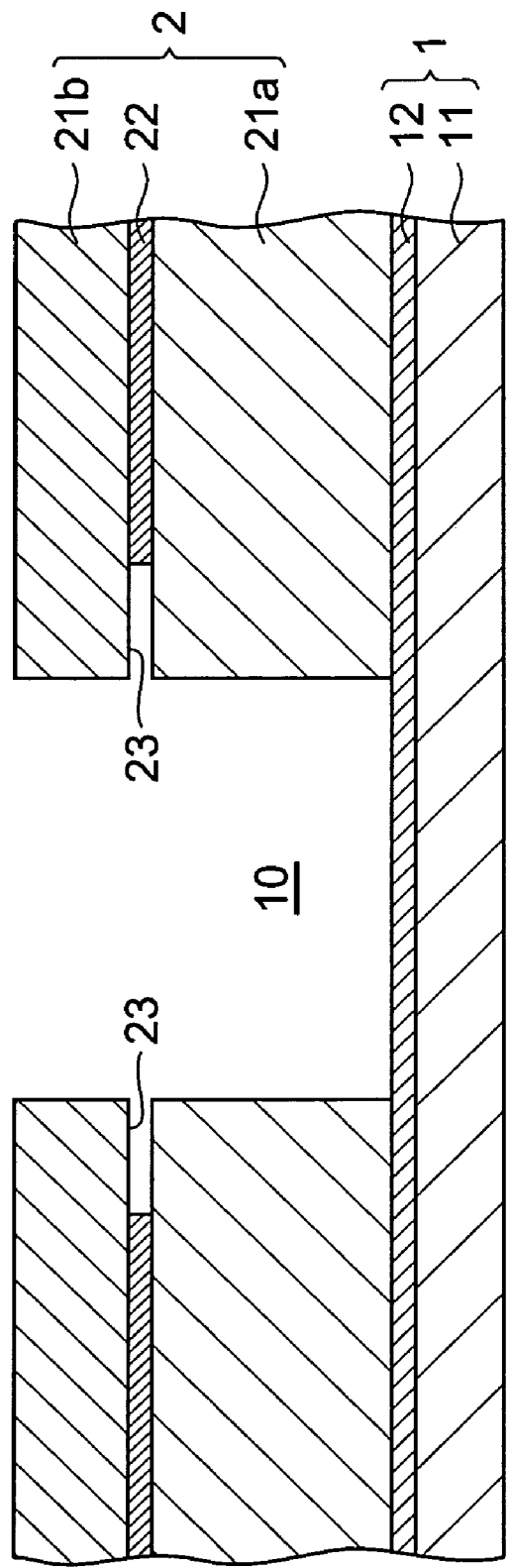
FIG. 6 is a sectional view for explaining the second embodiment of the method of forming a patterned material layer in accordance with the present invention.

Next, as shown in FIG. 4, the part to lift off 32 in the vacuum coating layer 3 is removed together with the resist frame (resist layer 2), so as to yield a patterned material layer 5 made of the material pattern part 31. Since the material pattern part 31 and the part to lift off 32 are separated from each other, the part to lift off 32 can especially easily be removed selectively. Using NMP, acetone, or the like, the resist frame and the part to lift off 32 are removed as in the liftoff in typical photolithography.

Second Embodiment

FIGS. 5, 6, 7, 8, and 9 are sectional views for explaining a second embodiment of the method of forming a patterned material layer in accordance with the present invention.

First, a resist layer 2 is formed on a substrate 1 (FIG. 5) in the second embodiment as well. The substrate 1 is one in which a plating electrode film 12 is formed on a support 11. The support 11 is the same as the substrate 1 in the first embodiment. The plating electrode film 12 is formed when a material which can be used as a plating electrode (which is preferably the same material as that of a plating layer 4 to be formed later) such as conductive metal, ceramics, or organic matter is formed into a film by a method such as sputtering, CVD, vapor deposition, or electroless plating. Then, the resist layer 2 having the same three-layer structure as that of the first embodiment is formed on the plating electrode film 12.

Figure 7:
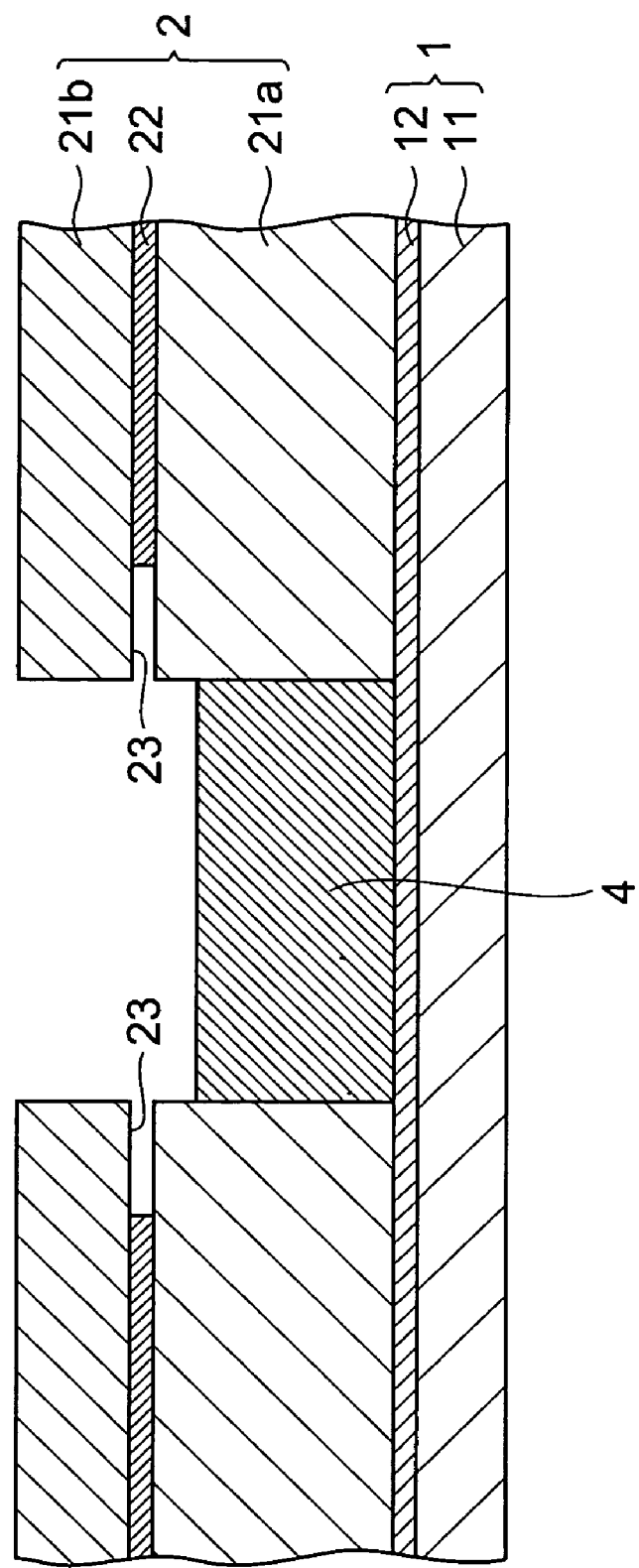
FIG. 7 is a sectional view for explaining the second embodiment of the method of forming a patterned material layer in accordance with the present invention.

Subsequently, by way of the same exposing step and developing step as those of the first embodiment, a resist frame made of the patterned resist layer 2 is formed (FIG. 6), and then the plating layer 4 is formed on the exposed part of the plating electrode film 12 in the trench 10 (FIG. 7: plating layer forming step). The plating layer 4 is formed with a thickness smaller than that of the first photosensitive resin layer 21a. The material for the plating layer 4 is appropriately selected from platable materials according to the use of the patterned material layer and the like. Its examples include NiFe (Permalloy) and Cu.

Figure 8:
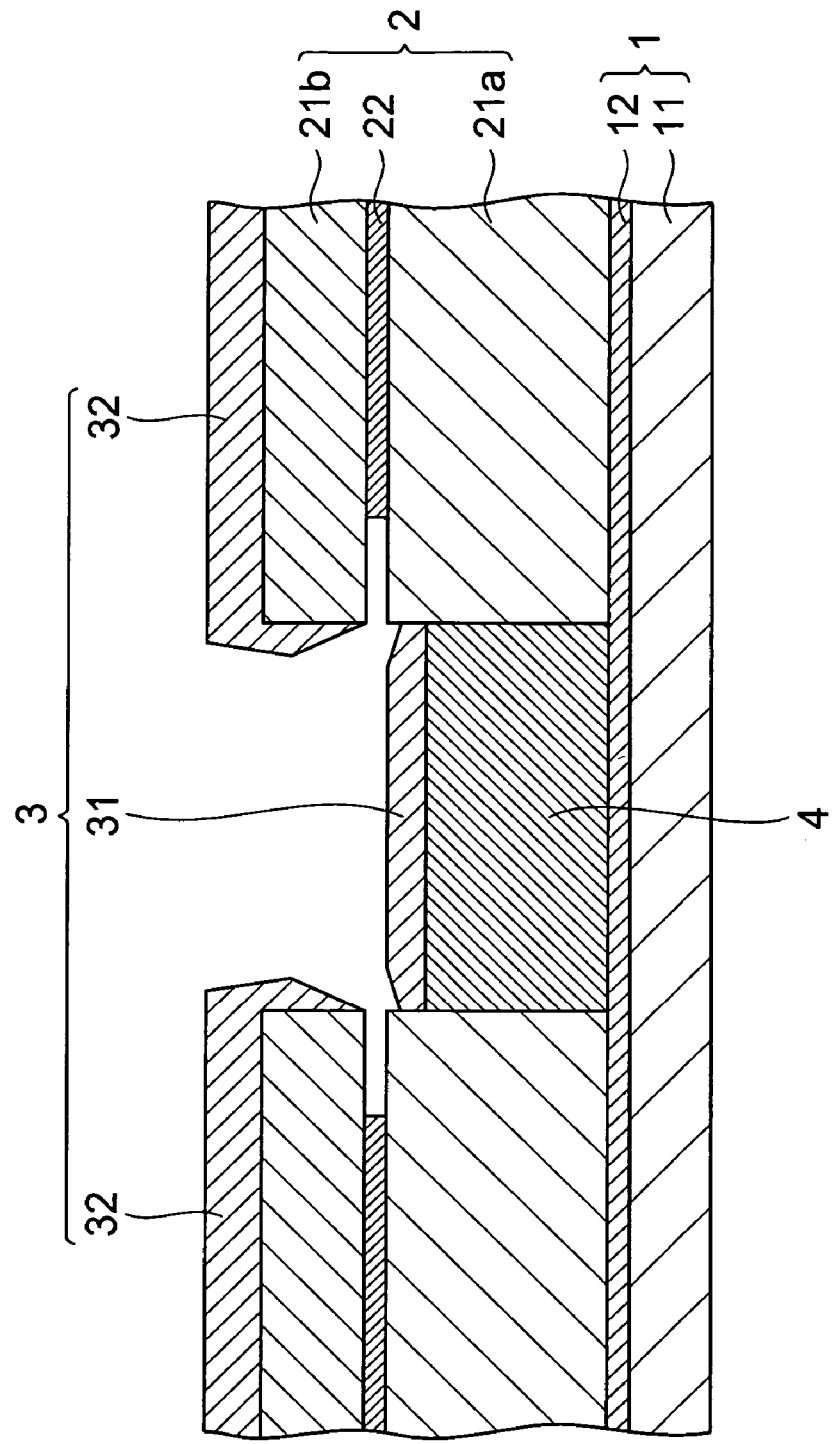
FIG. 8 is a sectional view for explaining the second embodiment of the method of forming a patterned material layer in accordance with the present invention.

Subsequently, a vacuum coating layer 3 is formed by vacuum coating (FIG. 8). Here, a material pattern part 31 of the vacuum coating layer 3 is formed on a surface of the plating layer 4 opposite from the substrate 1. Preferably, the total thickness of the plating layer 4 and material pattern part 31 is not greater than the thickness of the first photosensitive resin layer 21a.

Figure 9:
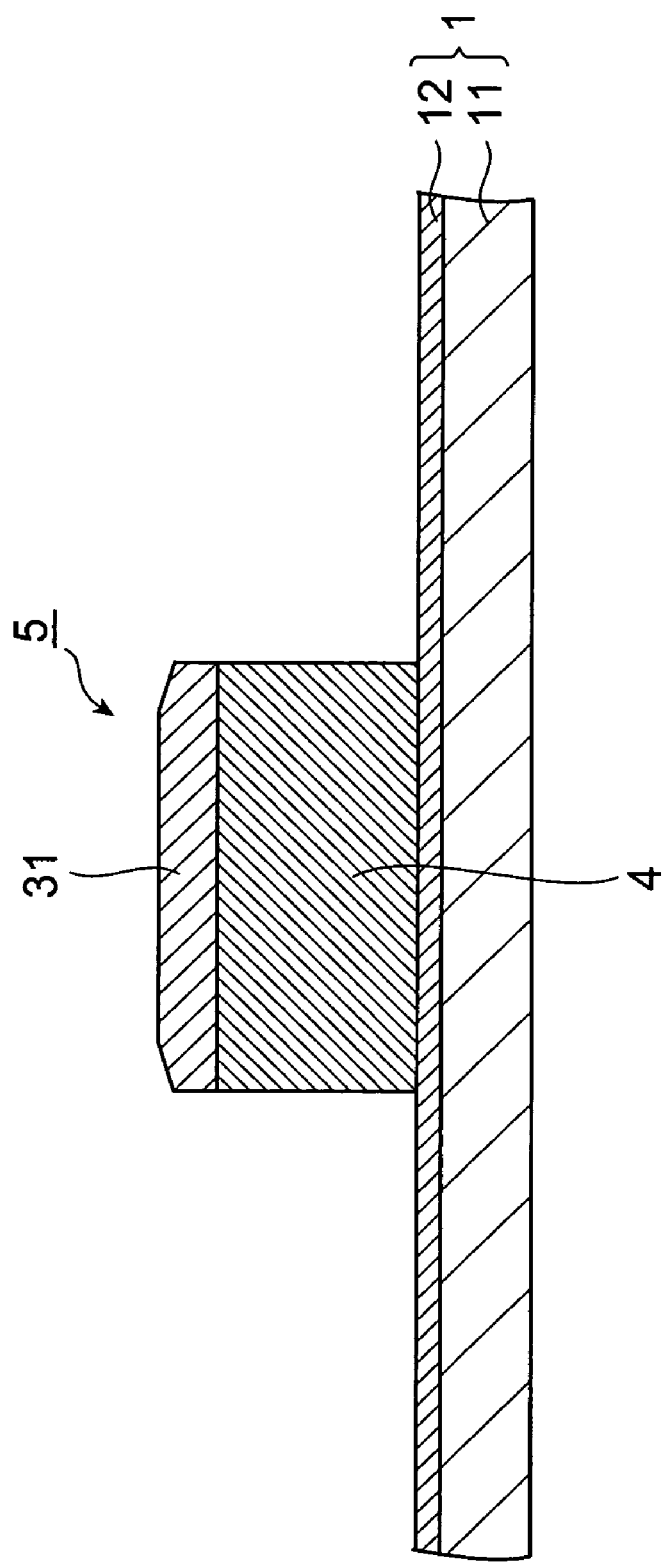
FIG. 9 is a sectional view for explaining the second embodiment of the method of forming a patterned material layer in accordance with the present invention.
Figure 10:
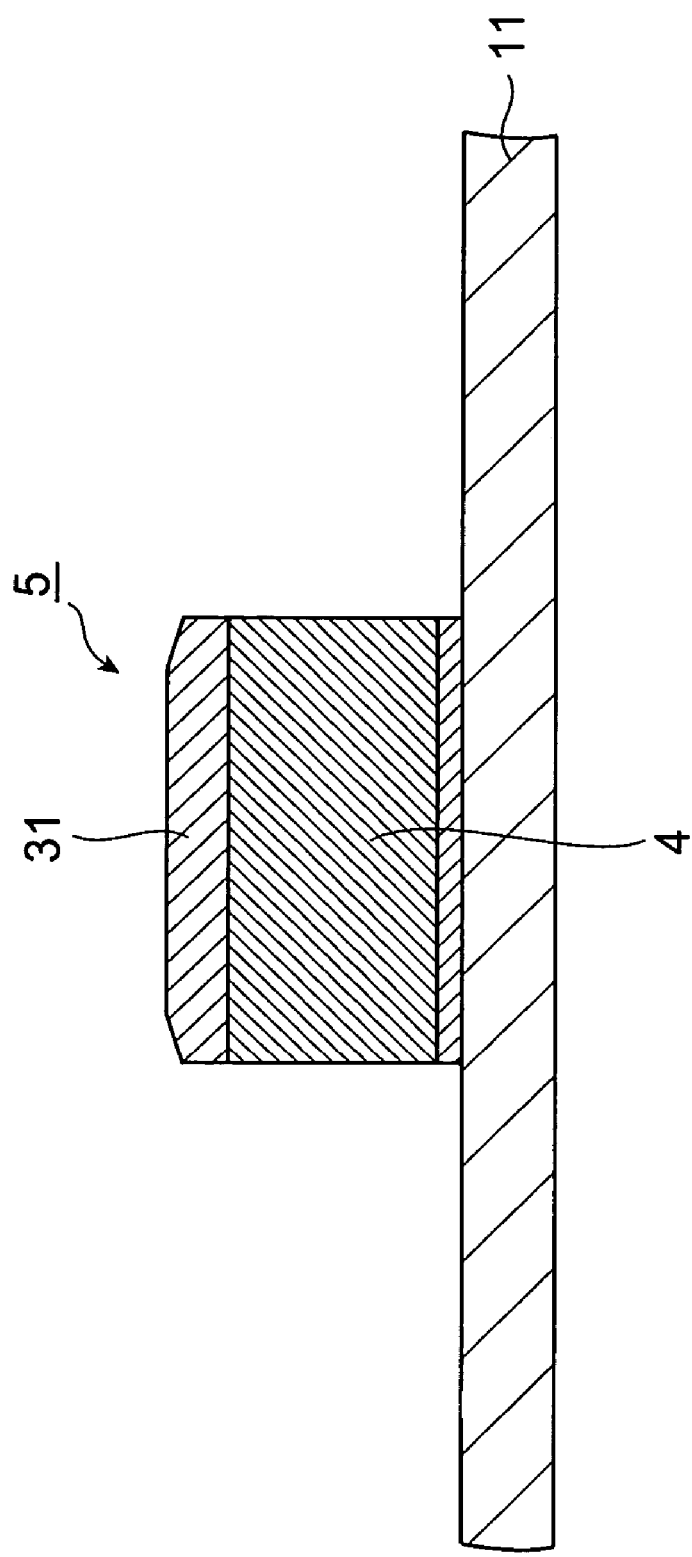
FIG. 10 is a sectional view for explaining the second embodiment of the method of forming a patterned material layer in accordance with the present invention.

In the liftoff step, a part to lift off 32 in the vacuum coating layer 3 is removed together with the resist frame (resist layer 2), so as to yield a patterned material layer 5 constituted by the material pattern part 31 and plating layer 4 (FIG. 9). Then, dry etching (milling, RIE, or the like) with the material layer 5 as a mask removes the part of plating electrode film 12 not covered with the material layer 5 (FIG. 10).

Third Embodiment

Figure 11:
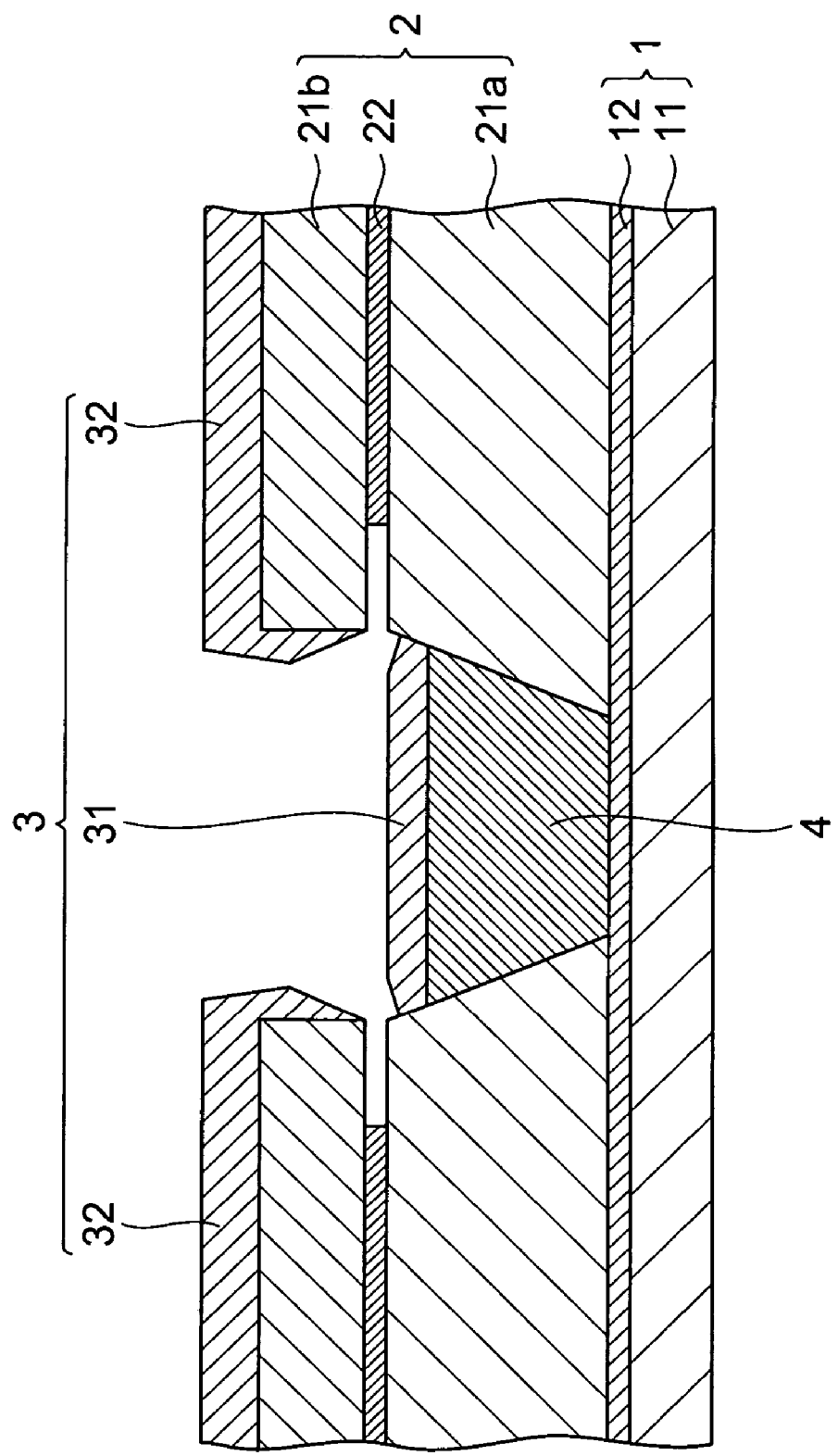
FIG. 11 is a sectional view for explaining a third embodiment of the method of forming a patterned material layer in accordance with the present invention.
Figure 12:
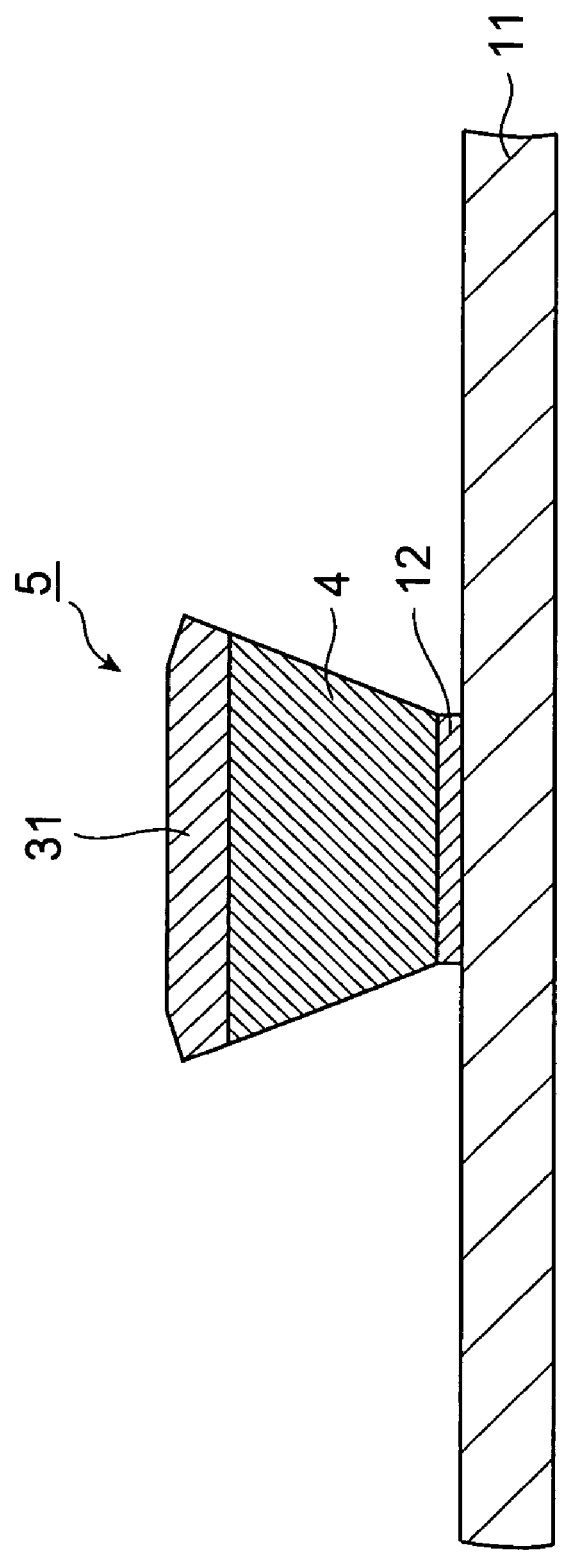
FIG. 12 is a sectional view for explaining the third embodiment of the method of forming a patterned material layer in accordance with the present invention.

FIGS. 11 and 12 are sectional views for explaining a third embodiment of the method of forming a patterned material layer in accordance with the present invention.

FIG. 11 is a sectional view showing a state after the vacuum coating step, where the vacuum coating layer 3 is formed. In the third embodiment, side faces of the first photosensitive resin layer 21a are tilted in the resist pattern (resist layer 2) formed with a trench. This can incline the side faces of the material layer made of the plating layer 4 and material pattern part 31 with respect to a main surface of the substrate 1. The side faces of the first photosensitive resin layer 21a can be tilted, for example, when the first photosensitive resin layer 21a cured upon exposure to light is heated to its glass transition temperature or higher so as to be fluidized. Employing a photosensitive resin less transparent to exposure light as the first photosensitive resin 21a can also tilt the side faces of the first photosensitive resin layer 21a.

Subsequently, by way of the removal of the resist frame and the like and the removal of the plating electrode film 12 by dry etching as in the first and second embodiments, a patterned material layer 5 is obtained (FIG. 12).

Figure 13:
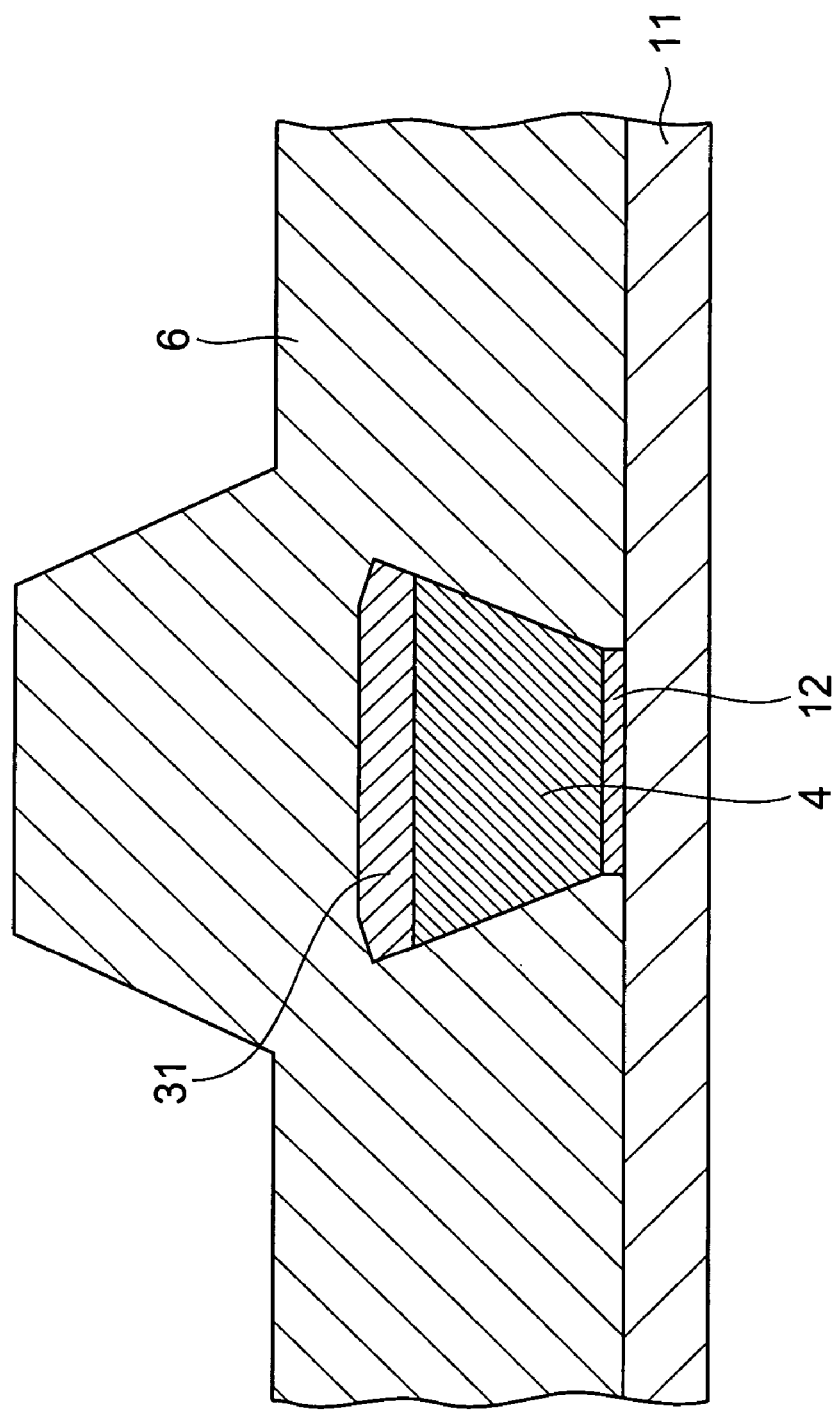
FIG. 13 is a sectional view for explaining the third embodiment of the method of forming a patterned material layer in accordance with the present invention.
Figure 14:
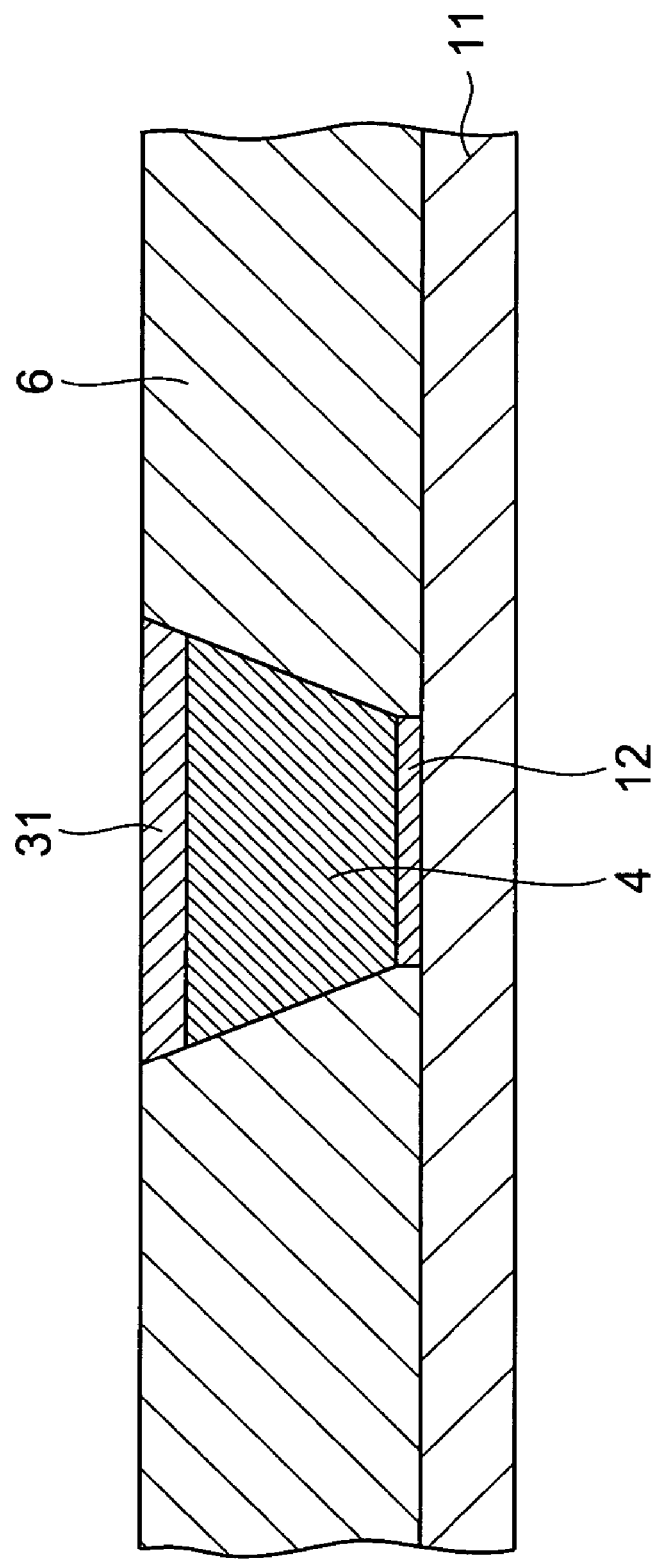
FIG. 14 is a sectional view for explaining the third embodiment of the method of forming a patterned material layer in accordance with the present invention.

When thus formed material layer 5 is used as a part of a thin-film magnetic head such as a magnetic head for perpendicular magnetic recording, for example, the plating layer 4 and material pattern part 31 are formed by a soft magnetic material such as Permalloy, a nonmagnetic insulating layer 6 made of alumina or the like is formed (FIG. 13), and then its surface is flattened by CMP (FIG. 14). Then, by way of other conventionally known steps, the material layer (soft magnetic material layer) is favorably used as a recording magnetic flux releasing part in a magnetic head for perpendicular magnetic recording as an embodiment of microdevice, for example.

Magnetic Head for Perpendicular Magnetic Recording

FIG. 15 is a sectional view schematically showing a magnetic head for perpendicular magnetic recording as an embodiment of microdevice in accordance with the present invention. The magnetic head for perpendicular magnetic recording 100 shown in FIG. 15 carries out an operation of recording magnetic information at a position where its medium-facing surface S faces a recording surface of a recording medium (not depicted). In FIG. 15, (a) and (b) show a cross section perpendicular to the medium-facing surface S and an end face of the magnetic head for perpendicular magnetic recording as seen from the medium-facing surface S side, respectively.

The magnetic head for perpendicular magnetic recording 100 is configured such that an insulating layer 41 made of a nonmagnetic insulating material, a reproducing head part 50 for reading magnetic information by utilizing a magnetoresistive effect, a separation layer 42 made of a nonmagnetic insulating material, a recording head part 30 for performing a magnetic recording operation, and an overcoat layer 45 made of a nonmagnetic insulating material are laminated in this order on a base layer 60 made of a ceramic material such as $Al_2O_3 \cdot TiC$.

The recording head part 30 is provided on the reproducing head part 50 by way of the separation layer 42. The recording head part 30 is configured such that an auxiliary magnetic pole 36 adjacent to the separation layer 42, a gap layer 38 including a thin-film coil 39 embedded therein, and a magnetic pole 35 are laminated in this order. The magnetic pole 35 and auxiliary magnetic pole 36 are magnetically connected to each other through a joint 37 made of a magnetic material filling an opening 380 of the gap layer 38.

The magnetic pole 35 is provided adjacent to the gap layer 38. Namely, using the whole laminate comprising the base layer 60, reproducing head part 50, separation layer 42, auxiliary magnetic pole 36, gap layer 38 having the thin-film coil 38 embedded therein, and junction 37 as a support, the magnetic pole 35 is provided on one of main surfaces of the support.

The magnetic pole 35 includes a magnetic flux releasing part 33 having an exposed surface 33S exposed to the medium-facing surface S, and a yoke part 34 formed so as to magnetically connect with the junction 37 while shielding the part of magnetic flux releasing part 33 opposite from the medium-facing surface S from its surroundings.

The magnetic flux releasing part 33 is configured such that a plating electrode film 12, plating layers 4a, 4b, and a material pattern part 31 are laminated. The magnetic flux releasing part 33 is divided into a rod-shaped pole part having the exposed surface 33S exposed to the medium-facing surface S, and a support part provided on the side opposite from the exposed surface 33S of the pole part, whereas the pole part extends like a rod from the support part. FIG. 15 shows the plating layer in the pole part as 4a, and the plating layer in the support part as 4b.

In the case of a magnetic head for perpendicular magnetic recording, a signal magnetic field is considered to be recorded on a recording medium mainly by a perpendicular magnetic field based on a magnetic flux concentrated near a trailing edge. The side of the material pattern part 31 in the magnetic flux releasing part 33 acts as the trailing edge side during perpendicular magnetic recording. The material pattern part 31 is formed by vacuum coating and thus can attain a higher saturated magnetic flux density than that obtained by plating. Therefore, the recording head for perpendicular magnetic recording 100 having the magnetic flux releasing part 33 formed by employing the method of the third embodiment exhibits an excellent recording characteristic.

Since the exposed surface 33S of the magnetic flux releasing part 33 has a trapezoidal form, so-called side erase caused by the tilt (skewing) of the magnetic head with respect to the extending direction of a track to be recorded is restrained from occurring. It has conventionally been very difficult for vacuum coating such as sputtering to form a material layer having a trapezoidal cross section under such precision control as to attain a given base angle. Such film forming has been impossible until a method based on a resist frame having a three-layer structure such as that of the present invention is employed.

The gap layer 38 is constituted by three gap layer parts 38a, 38b, and 38c. The gap layer part 38a is provided adjacent to the auxiliary magnetic pole 36, whereas a thin-film coil 39 having a winding structure which is spirally wound about the opening 380 is disposed on the gap layer part 38a. The gap layer part 38b is provided so as to cover the gaps between the windings of the thin-film coil 39 and their surrounding areas. The gap layer part 38c covers the gap layer part 38b and forms the opening 380.

The reproducing head part 50 has such a configuration that a lower lead shield layer 51a adjacent to the insulating layer 41, a shield gap film 52, and an upper lead shield layer 51b are laminated in this order. A magnetoresistive device 55 as a reproducing device is embedded in the shield gap film 52, whereas one end face of the magnetoresistive device 55 is exposed to the medium-facing surface S. The magnetoresistive device 55 functions as the reproducing device by detecting magnetic information of a recording medium by using a giant magnetoresistive (GMR) or tunneling magnetoresistive (TMR) effect, for example.

The part other than the magnetic flux releasing part 33 in the magnetic head for perpendicular magnetic recording 100 can be formed by appropriately employing materials and forming methods typically used in the manufacture of thin-film magnetic heads.

In the above-mentioned third embodiment, a film is formed by vacuum coating on the plating layer. In a reverse fashion, a vacuum coating layer having a material pattern part covering the exposed part in the trench and a part to lift off covering the resist frame may initially be formed by vacuum coating, and then, by way of a plating layer forming step of forming a plating layer covering the vacuum coating layer, the part to lift off in the vacuum coating layer and the part covering the part to lift off in the plating layer may be removed together with the resist frame in the liftoff step.

In the latter case, a material layer having the vacuum coating layer is formed on the substrate side. Therefore, when a patterned material layer is used as a magnetic pole of a thin-film magnetic head for longitudinal recording, for example, its gap layer side can be employed as a layer having a high saturated magnetic flux density.

Though preferably employed in particular in the manufacture of thin-film magnetic heads such as magnetic heads for perpendicular magnetic recording, the method of manufacturing a microdevice in accordance with the present invention is also favorable as a manufacturing method which can thin microdevices such as thin-film inductors, semiconductor devices, thin-film sensors, and thin-film actuators, for example, in their manufacture.

EXAMPLES

The present invention will now be explained in more detail with reference to examples. However, the present invention is not limited to the following examples.

Example 1

Employing the above-mentioned first embodiment, a patterned material layer was made. First, a polyhydroxystyrene-based photosensitive resin, AZ DX5105P (product name) manufactured by AZ Electronic Materials, was applied onto an Si substrate (having a diameter of 6 inches) by spin coating, and then was prebaked by heating at 110° C. for 120 seconds, so as to form a first photosensitive resin layer having a thickness of 0.6 μm. Subsequently, polymethylglutarimide, LOL (product name) manufactured by MCC, was applied onto the first photosensitive resin layer by spin coating, and then was prebaked by heating at 110° C. for 120 seconds, so as to form an intermediate resin layer having a thickness of 0.05 μm. Further, as with the first photosensitive resin layer, a second photosensitive resin layer having a thickness of 0.3 μm was formed on the intermediate resin layer. The foregoing operation completed a resist layer having a three-layer structure on the substrate.

Using an exposure system at an exposure wavelength of 248 nm, NSR-TFHEX14C (product name) manufactured by Nikon, the resist layer was exposed to the light under a condition where NA=0.6, σ=0.7, and Dose=40 mJ/cm$^2$ through a binary mask having an isolated line with a clear width of 0.3

μm, and then was heated at 120° C. for 120 seconds as reversal bake. After the exposure, development was effected while using an aqueous solution of 2.38 mass % tetramethylammonium hydroxide as a developing solution. As a result, a trench was formed with a clear contrast at a width of 0.3 μm, and the intermediate resin layer was removed from the exposed part side near the side faces of the trench, whereby grooves having a depth of 0.05 μm were formed.

A vacuum coating layer (having a thickness of 0.7 μm) made of CoNiFe (having a saturated magnetic flux density of 1.8 T) was formed such as to be deposited on the exposed substrate in the trench and the resist frame by sputtering under the following condition:
   Apparatus: IBE-IBD manufactured by Vecco
   Gas: xenon
   Gas flow rate: 3.5 sccm
   Pressure: $1.5 \times 10^{-4}$ Torr
   Sputtering angle (angle with respect to a main surface of a substrate): 90°
   Beam current: 200 mA
   Beam voltage: 1500 V, DC
   Accelerating voltage: −150 V Further, by dipping and swinging in NMP, the part to lift off formed on the resist frame was removed from the vacuum coating layer together with the resist frame, whereby a material layer made of CoNiFe and patterned with a favorable contrast was obtained on the substrate.

Example 2

Employing the above-mentioned second embodiment, a patterned material layer was made. First, using an Si substrate (having a diameter of 6 inches) as a support, a plating electrode film having a thickness of 0.1 μm was formed on one surface of the support by sputtering under the following condition, and the resulting product was employed as a substrate.
   Apparatus: SPF-740H (product name) manufactured by NEC ANELVA (DC sputtering apparatus)
   Target: NiFe
   Power: 1000 W
   Ar flow rate: 50 sccm
   Gas pressure: 2.0 mTorr (NiFe)

Subsequently, a resist frame was formed as in Example 1, and then an NiFe plating layer having a thickness of 0.4 μm was formed in a plating bath in which Fe ions were added to an Ni Watt bath. Thereafter, a vacuum coating layer having a thickness of 0.3 μm was formed on the plating layer and resist frame by sputtering under the same condition as with Example 1.

By dipping and swinging in NMP, the part to lift off formed on the resist frame in the vacuum coating layer was removed together with the resist frame, so as to form a vacuum coating layer made of CoNiFe on the plating layer made of NiFe, whereby a patterned material layer with a favorable contrast was obtained on the substrate.

Example 3

Employing the above-mentioned third embodiment, a patterned material layer having a trapezoidal cross section was made. Using a chemically amplified resist based on polyhydroxystyrene less transparent to exposure light, DP-GM300 (product name) series manufactured by Tokyo Ohka Kogyo, a first photosensitive resin layer was initially formed so as to yield a thickness of 0.7 μm after prebaking. The other operations were performed as in Example 2, so as to form a resist frame in which side faces of the first photosensitive resin layer were tilted, the bottom of the trench had a width of 0.2 μm, and the part higher than the topmost part of the first photosensitive resin layer had a width of 0.3 μm.

Using this resist pattern, a material layer including a vacuum coating layer formed by sputtering on a plating layer was patterned with a favorable contrast as in Example 2. Further, a flattening film (nonmagnetic insulating material layer) made of $Al_2O_3$ was formed by bias sputtering so as to cover the patterned material layer and its surrounding parts of the substrate, and then was polished by CMP using Avant Gaard (product name) manufactured by SpeedFam-IPEC as a CMP apparatus with a slurry of alumina (having a particle size of 250 nm) as a polishing liquid with a pad of foamed urethane until the thickness became 0.6 μm, whereby a material layer with a flattened surface was obtained.

The present invention provides a method of forming a patterned material layer which can pattern a material layer formed on a substrate by vacuum coating with a sufficiently high accuracy even when its thickness is large and can easily form a right angle or any other given angle between a side face and the substrate. The method of manufacturing a microdevice in accordance with the present invention yields a microdevice such as a thin-film magnetic head having a magnetic pole with a high saturated magnetic flux density.

What is claimed is:

1. A method of forming a patterned material layer, the method comprising:
   a resist layer forming step of forming a resist layer on a substrate, the resist layer having a first photosensitive resin layer of a certain thickness, an intermediate resin layer of a certain thickness that is soluble in a developing solution, and a second photosensitive resin layer which are laminated in this order;
   an exposing step of exposing the resist layer to light in a predetermined pattern;
   a developing step of partly removing the resist layer so as to form a trench exposing the substrate and partly removing the intermediate resin layer so as to form a groove on a side face of the trench, thereby forming by one dissolution into the developing solution a resist frame that includes a portion of the first photosensitive resin layer, a portion of the intermediate resin layer, and a portion of the second photosensitive resin layer;
   a vacuum coating step of forming a vacuum coating layer having a material pattern part covering the exposed part of the substrate and a part to lift off covering the resist frame by a vacuum coating process, the vacuum coating layer having a thickness that is thinner than the thickness of the first photosensitive resin layer; and
   a liftoff step of removing the part to lift off in the vacuum coating layer together with the resist frame, so as to yield a patterned material layer.

2. A method of forming a patterned material layer according to claim 1, wherein, in the vacuum coating step, the vacuum coating layer is formed so as to yield a gap between the material pattern part and the part to lift off near the groove.

3. A method of forming a patterned material layer according to claim 1, further comprising a plating layer forming step of forming a plating layer covering an exposed part of the substrate;
   wherein the material pattern part covers the plating layer.

4. A method of forming a patterned material layer according to claim 1, wherein the vacuum coating is sputtering or vacuum evaporation.

5. A patterned material layer obtainable by the method of forming a patterned material layer according to claim 1.

6. A method of manufacturing a microdevice, the method including the step of forming a patterned material layer on a substrate by the method of forming a patterned material layer according to claim 1.

7. A microdevice obtainable by the method of manufacturing a microdevice according to claim 6.

8. A method of forming a patterned material layer according to claim 1, wherein, in the resist layer forming step, the resist layer is formed such that the thickness of the intermediate resin layer is thinner than the thickness of the first photosensitive layer.

9. A method of forming a patterned material layer according to claim 1, wherein, in the developing step, the resist frame is formed such that an opening width of the first photosensitive resin layer is the same as an opening width of the second photosensitive resin layer.

10. A method of forming a patterned material layer according to claim 1, wherein both the first and second photosensitive resin layers are a positive type or a negative type.

11. A method of forming a patterned material layer according to claim 1, wherein, in the exposing step, the first and second photosensitive resin layers are exposed to the light simultaneously by one exposure.

12. A method of forming a patterned material layer according to claim 1, wherein the intermediate resin layer is soluble in an alkaline developing solution.

* * * * *